(12) United States Patent
Gellrich et al.

(10) Patent No.: US 8,027,024 B2
(45) Date of Patent: Sep. 27, 2011

(54) REPLACEMENT DEVICE FOR AN OPTICAL ELEMENT

(75) Inventors: Bernhard Gellrich, Aalen (DE); Ulrich Weber, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 405 days.

(21) Appl. No.: 12/029,165

(22) Filed: Feb. 11, 2008

(65) Prior Publication Data
US 2008/0174758 A1    Jul. 24, 2008

Related U.S. Application Data

(63) Continuation of application No. PCT/EP2006/008160, filed on Aug. 18, 2006.

(60) Provisional application No. 60/710,680, filed on Aug. 23, 2005.

(51) Int. Cl.
*G03B 27/54* (2006.01)
*G03B 27/42* (2006.01)

(52) U.S. Cl. .......................................... 355/67; 355/53

(58) Field of Classification Search .................... 355/53, 355/67
See application file for complete search history.

(56) References Cited

U.S. PATENT DOCUMENTS

| | | | |
|---|---|---|---|
| 5,726,740 A | 3/1998 | Shiozawa et al. | |
| 6,654,101 B2 | 11/2003 | Suzuki et al. | |
| 2001/0038500 A1* | 11/2001 | Shibazaki | 359/823 |
| 2002/0167740 A1 | 11/2002 | Osterried et al. | |
| 2005/0057827 A1 | 3/2005 | Miyachi et al. | |
| 2005/0134972 A1 | 6/2005 | Kugler et al. | |
| 2005/0211867 A1* | 9/2005 | Margeson | 248/550 |
| 2007/0076184 A1 | 4/2007 | Kwan et al. | |
| 2007/0177122 A1* | 8/2007 | Loopstra et al. | 355/67 |

FOREIGN PATENT DOCUMENTS

EP    1 406 107 A2    4/2004
WO    WO 2005/050323    6/2005

* cited by examiner

*Primary Examiner* — Edward Glick
*Assistant Examiner* — Deoram Persaud
(74) *Attorney, Agent, or Firm* — Fish & Richardson P.C.

(57) ABSTRACT

Replacement devices for at least one replaceable optical element mounted at least indirectly in a lithographic projection exposure apparatus are disclosed. Lithography objectives and illumination systems are also disclosed. Methods for positioning a replaceable optical element within a lithographic projection exposure apparatus of this type, and methods for replacing a replaceable optical element within a lithographic projection exposure apparatus via a replacement device are also disclosed.

24 Claims, 3 Drawing Sheets

REPLACEMENT DEVICE FOR AN OPTICAL ELEMENT

CROSS-REFERENCE TO RELATED APPLICATIONS

This application is a continuation of, and claims priority under 35 U.S.C. §120 to, international application PCT/EP2006/008160, filed Aug. 18, 2006, which is hereby incorporated by reference. International application PCT/EP2006/008160 claims the benefit of U.S. Ser. No. 60/710,680, filed Aug. 23, 2005.

FIELD

The disclosure relates to a replacement device for at least one replaceable optical element mounted at least indirectly in a lithographic projection exposure apparatus. The disclosure also relates to a lithography objective and an illumination system. Moreover, the disclosure relates to a method for positioning a replaceable optical element within a lithographic projection exposure apparatus of this type, and a method for replacing a replaceable optical element within a lithographic projection exposure apparatus via a replacement device.

BACKGROUND

Lithography objectives are known in which the last optical element, that is to say the one closest to the wafer to be exposed, is replaceable.

SUMMARY

In some embodiments, the disclosure provides a replacement device for an optical element mounted at least indirectly in a lithographic projection exposure apparatus, which replacement device enables such replacement with high accuracies.

In certain embodiments, the disclosure provides a replacement device for at least one replaceable optical element mounted at least indirectly in a lithographic projection exposure apparatus, including at least one receptacle for the replaceable optical element, which can be introduced into a housing of an apparatus part of the projection exposure apparatus through at least one opening in the housing, wherein the replaceable optical element is held in the apparatus part on a separate holding structure, wherein the replaceable optical element is introduced into a fixing device for fixing on the separate holding structure, the effective forces of which fixing device essentially do not act on the separate holding structure or wherein the separate holding structure is at least approximately decoupled from the effective forces of the fixing device that are caused by the fixing. As a result, the positioning system is advantageously decoupled from the fixing system of the optical element.

In some embodiments, the replacement device is able to remove the optical element from the apparatus part and to retract or supply another optical element, which is specifically tuned to the changes within the apparatus part, into the apparatus part again. There is at least one opening in the housing of the apparatus part which is dimensioned in such a way that the receptacle can retract into the housing. In this case, the receptacle is able to position the optical element very accurately within the apparatus part. The replaceable optical element is held in the apparatus part on a separate holding structure. For fixing on the separate holding structure, the replaceable optical element is introduced into a fixing device. In an advantageous manner, the effective forces of the fixing device do not act on the separate holding structure. Undesirable influences on the adjoining components are minimalized as a result. The force locking is led locally and not via the separate holding structure, such that the latter can also be used as a manipulator device for fine positioning.

It can be advantageous if the apparatus part includes a lithography objective and/or an illumination system or parts thereof.

This can make it possible for instance to considerably improve the imaging performance of the lithography objective without intervening in the structure of the lithography objective.

It can be advantageous if the fixing device is embodied as a clamping device and the clamping forces do not act on the separate holding structure.

In some embodiments, the at least one receptacle can be retracted motively via a drive device and a guide device.

As a result, an at least partly automated replacement can also be effected in order for example to be able to carry out a double exposure of a region of a substrate using two different reticles during operation of the lithography objective.

The optical element can advantageously be arranged in a mount or changeable mount. In order to avoid deformations on the optical element, the mount can be decoupled from moments/torques of the separate holding structure and/or of the fixing device in the region of the fixing device.

It can be advantageous if the replaceable optical element has reference surfaces for detecting the position and orientation thereof. As a result, an accurate position and orientation of the replaceable optical element can advantageously be determined both during the replacement operation and during a final fine positioning of the replaceable optical element in the apparatus part for the lithography objective on the basis of the reference surfaces.

Spacer washers or tuning disks or spacers can be provided for the coarse propositioning of the replaceable optical element within the apparatus part on the separate holding structure. Moreover, adjustable bearing surfaces are also conceivable.

In a particularly advantageous structural configuration of the disclosure it may furthermore be provided that the separate holding structure has a manipulator device with at least one actuator for setting the replaceable optical element in at least one, in particular in six, degrees of freedom.

These measures enable the replaceable optical element introduced into the fixing device or clamping device to be finely adjusted in a plurality of degrees of freedom, in particular in six degrees of freedom. For this purpose, a first sensor system may be provided for determining the relative position and orientation of the replaceable element with respect to the apparatus part on the separate holding structure. The fine positioning particularly in the range of a few tens of nanometers of the replaceable optical element is accordingly carried out by the manipulator device using the data of the first sensor system and is controlled by a first control system via a closed control loop.

It can be advantageous if the replaceable optical element or the mount in which the replaceable optical element is arranged is mounted in a statically determined manner within the apparatus part.

In some embodiments, a separate supply device with a first receptacle for a replaceable optical element to be supplied, which can be retracted into the housing of the apparatus part through at least one first lateral opening in the housing, is provided, and a separate removal device with a second receptacle for the replaceable optical element to be removed, which can be retracted into the housing of the apparatus part through at least one second lateral opening, is provided.

As a result, the replaceable element to be removed can be removed by the removal device and the replaceable optical element to be supplied can be supplied by the supply device, synchronously and in a partly automated manner.

It is advantageous if at least the supply device or the removal device has a store for depositing the replaceable optical elements to be supplied or the replaceable optical elements that have been removed.

In some embodiments, a lithography objective is provided that includes a plurality of optical elements and including at least one replacement device.

In certain embodiments, an illumination system for microlithography is provided that includes a replacement device.

In some embodiments, a method for positioning a replaceable optical element within a lithography objective via a replacement device is provided.

In certain embodiments, a method for replacing a replaceable optical element within a lithography objective via a replacement device according to the disclosure is provided.

BRIEF DESCRIPTION OF THE FIGURES

Various exemplary embodiments of the disclosure are illustrated in principle below with reference to the drawings, in which.

DETAILED DESCRIPTION

Figure 1:
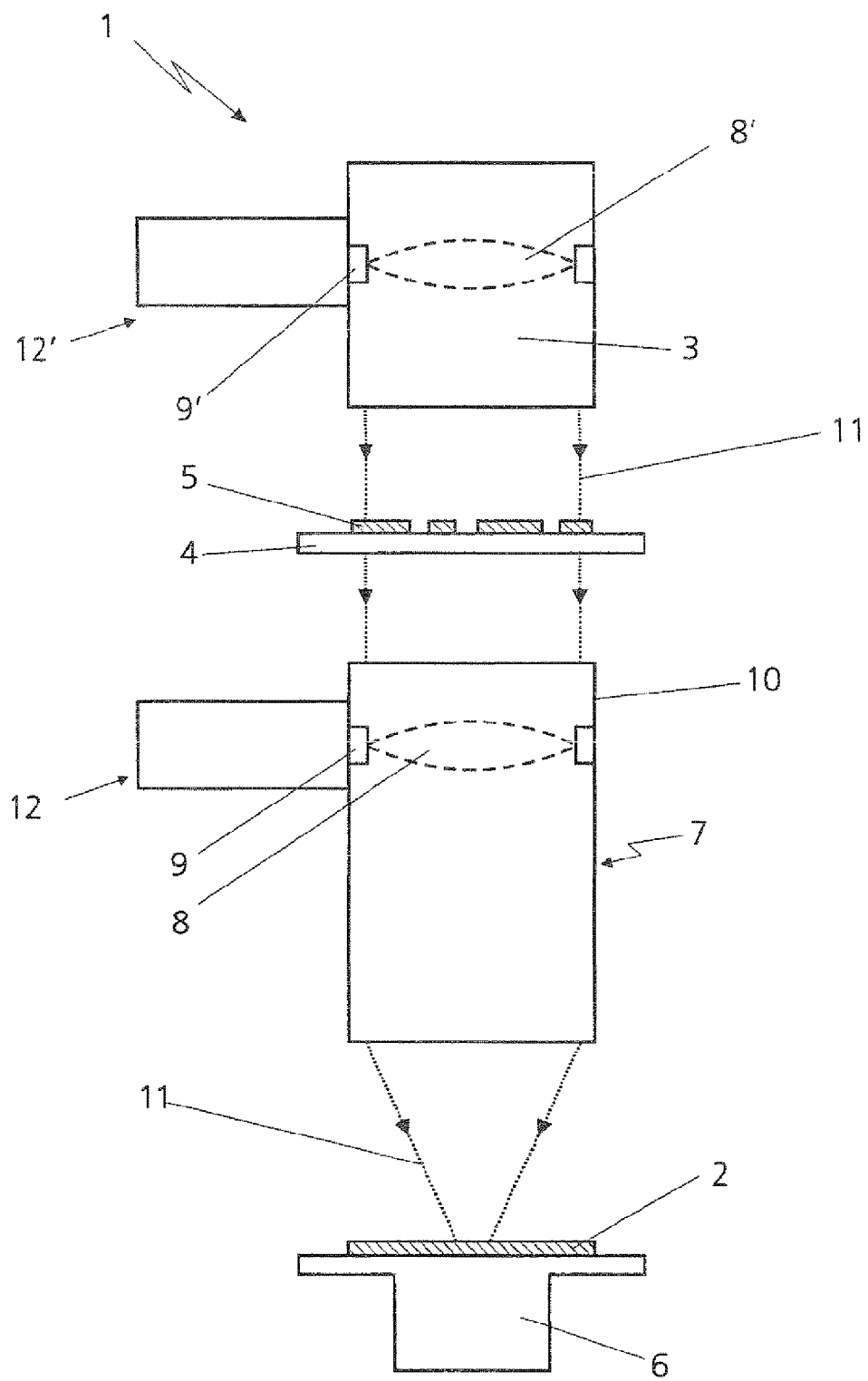
FIG. 1 shows a basic illustration of a projection exposure apparatus for microlithography which can be used for the exposure of structures onto wafers coated with photosensitive materials.

FIG. 1 illustrates a projection exposure apparatus 1 for microlithography. This apparatus serves for the exposure of structures onto a substrate coated with photosensitive materials, the substrate in general predominantly being composed of silicon and being referred to as wafer 2, for the production of semiconductor components, such as e.g. computer chips.

In this case, the projection exposure apparatus 1 essentially includes an illumination system 3, a device 4 for receiving and exactly positioning a mask provided with a grating-like structure, a so-called reticle 5, through which the later structures on the wafer 2 are determined, a device 6 for retaining, moving and exactly positioning precisely the wafer 2, and an imaging device, namely a lithography objective or projection objective 7 with a plurality of optical elements, such as e.g. lenses 8, which are mounted via mounts 9 and/or manipulators (not illustrated in FIG. 1) in a housing 10 of the lithography objective 7.

In this case, the basic functional principle provides for imaging the structures introduced into the reticle 5 onto the wafer 2 in demagnified fashion.

After exposure has been effected, the wafer 2 is correspondingly moved further, such that a multiplicity of individual fields, each with the structure prescribed by the reticle 5, are exposed on the same wafer 2.

The illumination system 3 provides a projection beam 11 used for the imaging of the reticle 5 on the wafer 2, for example light or a similar electromagnetic radiation. A laser or the like can be used as a source of the radiation. The radiation is shaped in the illumination system 3 via a plurality of optical elements such as lenses 8', for example, which are mounted in the illumination system 3 via mounts 9', in such a way that the projection beam 11, upon impinging on the reticle 5, has the desired properties with regard to diameter, polarization, coherence and the like.

Via the projection beam 11, an image of the introduced structures of the reticle 5 is generated and transferred to the wafer 2 in correspondingly demagnified fashion by the lithography objective 7, as has already been explained above. The lithography objective 7 has a multiplicity of individual refractive, diffractive and/or reflective optical elements, such as e.g. lenses 8, mirrors, prisms, plane-parallel plates and the like, only the lens 8 being illustrated in FIG. 1.

If the optical elements, such as the lenses 8, for example, within the lithography objective 7 change over the course of time, e.g. as a result of contaminations or material changes, and the performance of the lithography objective 7 deteriorates in such a way that the intended service life thereof cannot be achieved, they should be replaceable in order in particular also to be able to compensate for the imaging aberrations of the other optical elements (not illustrated in FIG. 1). Furthermore, a replacement may also be necessary during operation, in order for example to be able to carry out a double exposure of a region on the wafer 2 using two different reticles 5, or if different polarizations are intended to be used. It is desirable for such a replacement to be able to be carried out highly accurately, at least in a partly automated manner, and very rapidly. Likewise, it may be desirable to replace the lens 8' in the illumination system 3, too.

If the optical elements to be replaced, as in the present case, are lenses 8, 8' having a corresponding refractive power, the positional tolerances for the tilting setting or the tilting (rotation about rx, ry, rz) and also for the axial and the lateral displacement (z, x, y) may lie in the range of a few 10 nm. Such accuracies can no longer be achieved using spacer washers.

In FIG. 1, the optical elements 8, 8' are embodied such that they can be replaced with such a high accuracy via replacement devices 12, 12' according to the disclosure that are illustrated in a greatly simplified manner.

Figure 2:
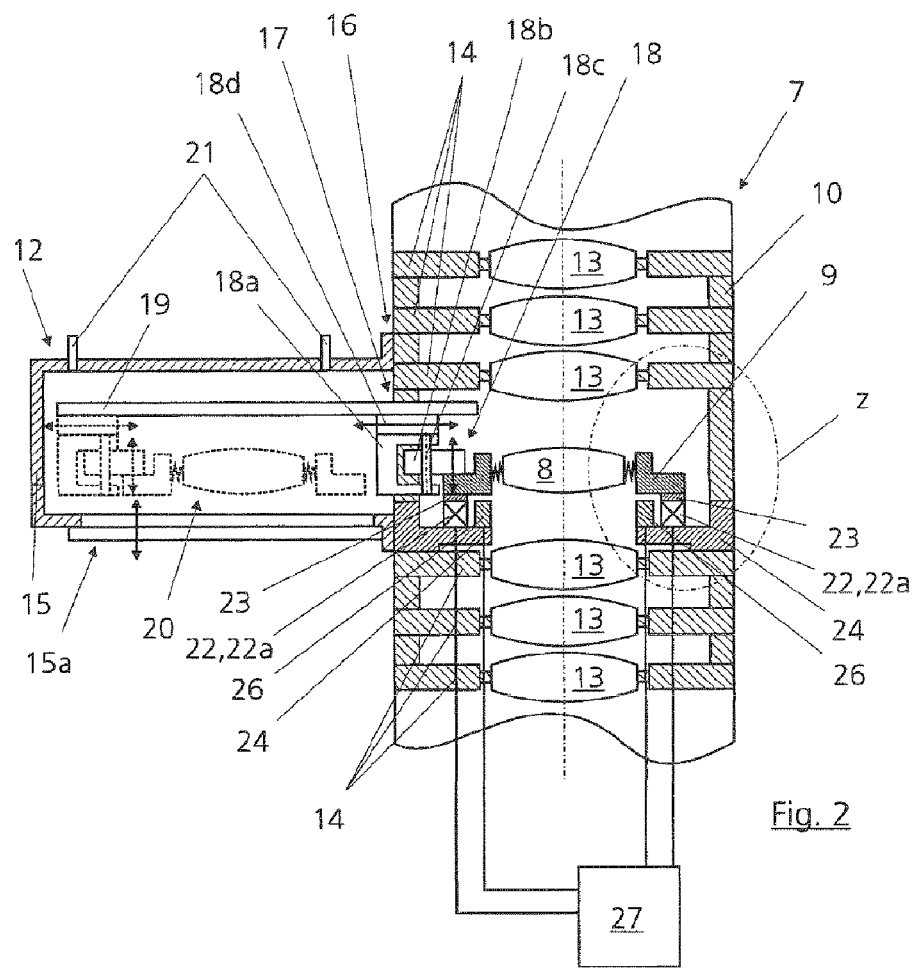
FIG. 2 shows a sectional view of a lithography objective with a plurality of optical elements and a replacement device.

FIG. 2 illustrates the lithography objective 7 with a plurality of optical elements 13 which are arranged in the housing 10 and which are arranged in mounts 14. The replaceable optical element 8 is arranged in a manner such that it is deformation-decoupled in the mount 9. In this case, the arrangement of the optical elements 13 within the lithography objective 7 should be regarded as purely by way of example. The lithography objective 7 may be suitable for any type of lithography. In the case of the lithography objective 7 it is possible, as described below, to replace the optical element 8, which is mounted in the lithography objective 7 directly or via the mount e.g. in a statically determined manner.

As can further be seen from FIG. 2, the replacement device 12 is provided for the replacement of the optical element 8 in its mount 9, the replacement device having a housing 15 with a gastight cover 15a, the housing being connected to the housing 10 of the lithography objective 7 via a gastight coupling 16. The replacement device 12 is mounted on the housing 10 with sufficient stiffness and remains there. The housing 10 of the lithography objective 7 has a lateral opening 17. As can further be seen from FIG. 2, the replacement device 12 has a receptacle 18 for the optical element 8 in its mount 9.

The receptacle 18 can be retracted motively through the lateral opening 17 of the housing 10 of the lithography objective 7 via a drive device (not illustrated) and a guide device 19. For this purpose, provision is made of a lifting device 18a, a device 18b for fixing the mount 9 of the optical element 8 on the lifting device 18a, a device 18c for guiding the lifting movement and a device 18d for moving the lifting device, which is guided in the guide device 19. The position of the optical element 8 in the replacement device 12, that is to say outside the lithography objective 7, is indicated by broken lines with the reference symbol 20. A coupling of the housing 15 of the replacement device 12 via controlled flow conditions in order to avoid contamination of the lithography objective 7 is likewise conceivable, that is to say that the pressure in the interior of the housing 10 is desirably greater than the pressure outside the housing 10 in order that a directional flow from the inside toward the outside arises. The replacement device 12 can be flushed with a highly pure inert gas or gas mixture through inlet and outlet openings 21. The replaceable optical element 8 in its mount 9 is held in the lithography objective 7 on a separate holding structure 22. The separate holding structure has a manipulator device 22a with a plurality of actuators (not illustrated) for setting the replaceable optical element 8 in e.g. six degrees of freedom. In further exemplary embodiments, it may also be possible to set a smaller number of degrees of freedom. The mount 9 of the replaceable optical element 8 is introduced into a fixing device, which is embodied as a clamping device 23, for fixing the separate holding structure 22. The clamping device 23 is illustrated only in a greatly simplified manner in FIG. 2; a more detailed illustration can be seen from FIG. 3. The separate holding structure 22 has, for isostatic mounting, for example, three supports with interfaces 22b (see FIG. 3, for example V-grooves, cones or the like, not illustrated in greater detail), only two of which in each case can be seen in simplified fashion in the figures. The separate holding structure 22 is held on a stiff basic mount 24 connected to the housing 10 of the lithography objective 7. The separate holding structure 22 is determined unambiguously relative to the lithography objective.

Figure 3:
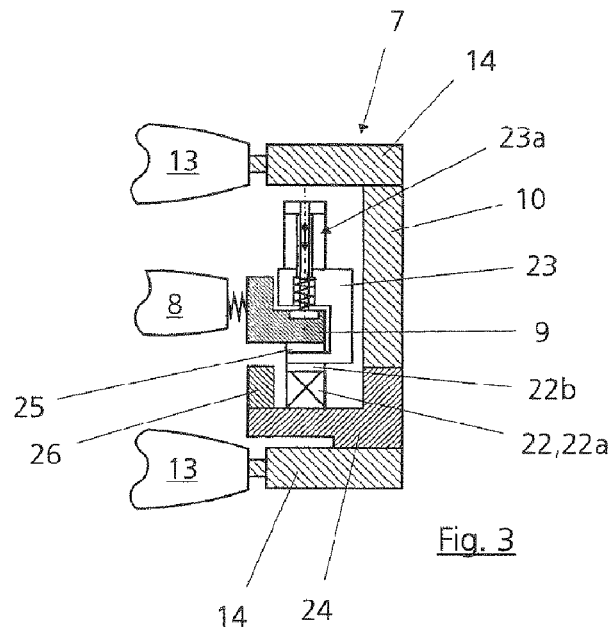
FIG. 3 shows an enlargement of the detail z from FIG. 2.

In an embodiment of the clamping device according to FIG. 3, the clamping device 23 that remains in the lithography objective 7 has a spring element 23a, which fixes the mount 9 of the optical element 8. As can further be seen from FIG. 3, the clamping forces, or the effective forces caused by the fixing, of the clamping device 23, which is embodied correspondingly sufficiently stiffly, act locally or essentially not on the separate holding structure 22, or the separate holding structure 22 is at least approximately decoupled from the effective forces of the clamping device 23 that are caused by the fixing. The clamping forces can be set manually or automatically. By way of example, spacer washers 25 are provided for the coarse prepositioning of the replaceable optical element 8 or of the mount 9. Furthermore, adjustable bearing surfaces would also be conceivable here (not illustrated). In the embodiment according to FIG. 3, the clamping device 23 could be realized with three modules spaced apart at 120° distances around the optical element 8. For this purpose, the individual modules are embodied in such a way that the optical element can be guided past the modules during the replacement operation. The fine positioning of the optical element 8 in the mount is effected by the manipulator device 22a. In this case, a first sensor system 26 is provided for determining the relative position and orientation of the replaceable optical element 8 with respect to the basic mount 24 or with respect to other adjacent optical elements 13 or with respect to a reference point or reference points. The replaceable optical element 8 has reference surfaces (not illustrated) for detecting the position and orientation. The fine positioning of the replaceable optical element 8 is effected by a first control system 27 using the data of the first sensor system 26 via the manipulator device 22a.

A second sensor system (not illustrated) arranged in the region of the receptacle 18 determines the position and the orientation of the replaceable optical element 8 during the replacement operation, wherein a second control system (likewise not illustrated) is provided, which controls the guidance and the drive of the receptacle 18 based on the position and orientation of the replaceable optical element 8 that are monitored by the second sensor system. The replaceable optical element 8 and the mount 9 can be mounted in a statically determined manner within the lithography objective 7.

In some embodiments, a method for positioning the replaceable optical element 8 within the lithography objective 7 via the replacement device 12 can proceed as follows. The replaceable optical element 8 is deposited onto the separate holding structure 22, which has a manipulator device 22a. The replaceable optical element 8 is coarsely prepositioned relative to the separate holding structure 22 and fixed via the clamping device 23. The replaceable optical element 8 is oriented with high accuracy relative to the housing 10 of the lithography objective 7 via the manipulator device.

In certain embodiments, the coarse prepositioning is effected for instance up to an orientation accuracy of the optical element 8 of up to 1 µm. The subsequent orientation with high accuracy achieves positioning accuracies of less than 10 nm.

Figure 4:
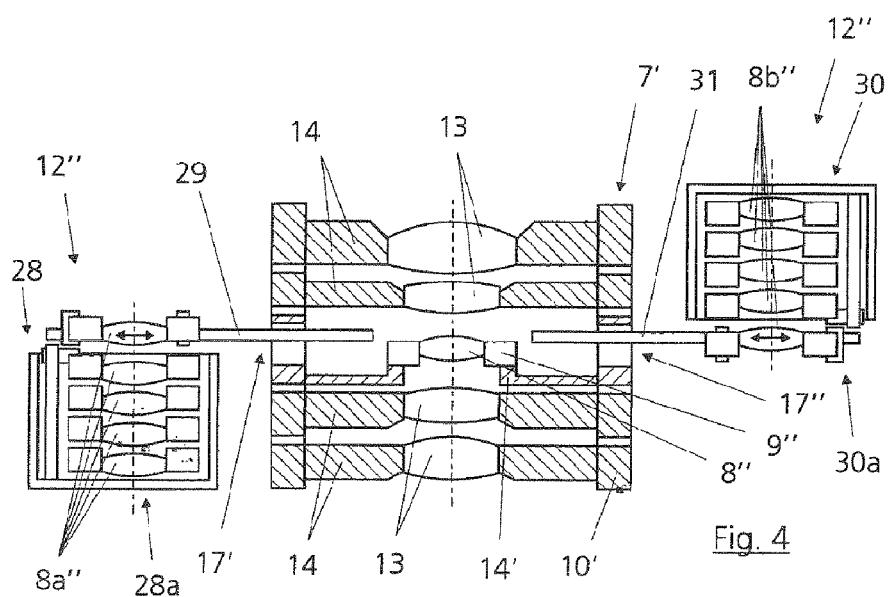
FIG. 4 shows a sectional view of a lithography objective with a plurality of optical elements and a replacement device.

An embodiment of a lithography objective 7' with a housing 10' is illustrated in simplified fashion in FIG. 4. In this case, a plurality of optical elements 13 are mounted in mounts 14 in the lithography objective 7'. Furthermore, a replaceable optical element 8" is arranged in a mount 9" on a basic mount 14'. A replacement device 12" includes a separate supply device 28 with a first receptacle 29 for a replaceable optical element 8a" to be supplied, which can be retracted into the housing 10' of the lithography objective 7' through a first lateral opening 17' in the housing, and a separate removal device 30 with a second receptacle 31 for the replaceable optical element 8b" to be removed, which can be retracted into the housing 10' of the lithography objective 7' through a second lateral opening 17" in the housing. As a result, a replaceable optical element 8" to be removed can be removed by the removal device 30 and, synchronously, a replaceable optical element 8a" to be supplied can be supplied by the supply device 28. The supply device 28 has e.g. a store 28a for depositing the replaceable optical elements 8a" to be supplied. The removal device 30 has e.g. a store 30a for depositing the replaceable optical elements 8b" that have been removed.

In the present exemplary embodiments, the replaceable optical element 8" is arranged in the vicinity e.g. of a pupil. The precise devices for fixing and retaining the replaceable optical element 8" within the lithography objective 7' are not illustrated in greater detail in FIG. 4. They can be embodied in accordance with FIGS. 2 and 3. The optical element 8, 8', 8" may be e.g. a diaphragm, a lens, a mirror, a beam splitter cube, a refractive or diffractive optical element or a group of the elements mentioned.

A method for replacing the replaceable optical element 8" within the lithography objective 7' via the replacement device 12" can be carried out as follows. The fixing—effected by the clamping device 23—of the replaceable optical element 8" to be removed on the separate holding structure 22 having the manipulator device 22a is released. The replaceable optical element 8" to be removed is picked up by the removal device 30, wherein, at least approximately simultaneously, the replaceable optical element 8a" to be supplied is picked up by the supply device 28. An at least approximately synchronous movement is effected by the removal device 30 and the supply device 28, wherein, virtually simultaneously, the optical element 8" to be removed is removed from the lithography objective 7' and the optical element 8a" to be supplied is introduced into the lithography objective 7' and deposited on the separate holding structure 22. The replaceable optical element 8a" to be supplied is coarsely prepositioned relative to the separate holding structure 22 and fixed via the clamping device 23. The replaceable optical element 8a" to be supplied is oriented with high accuracy relative to the housing 10' of the lithography objective 7' via the manipulator device 22a.

In some embodiments, the fifth step can be omitted if a coarse prepositioning of the optical element already yields good results with regard to the imaging quality. In such cases, the manipulator unit 22a and its assigned sensors 26 and also the control device 27 can then be omitted as well.

In certain embodiments (not illustrated), the replacement device can also be embodied as a rotary carousel or the like.

What is claimed is:

1. A system, comprising:
   an apparatus part of a lithographic projection exposure apparatus, the apparatus part comprising:
   a housing;
   a mount;
   a holding structure configured to hold an optical element in the mount, the holding structure being different from the housing; and
   a clamping device configured to provide clamping forces to fix the optical element relative to the holding structure, the clamping forces of the clamping device being such that they essentially do not act on the holding structure; and
   a receptacle for the optical element, the receptacle being at least indirectly mounted in the lithographic projection exposure apparatus,
   wherein:
   the housing has an opening through which the receptacle can be moved from being inside the housing to being outside the housing;
   in a first position, the receptacle and the optical element are inside the housing;
   in a second position, the receptacle and the optical element are outside the housing;
   the clamping device is inside the housing when the receptacle is in the first position; and
   the clamping device is inside the housing when the receptacle is in the second position.

2. The system as claimed in claim 1, wherein the apparatus part comprises a lithography objective, part of a lithography objective, a lithography illumination system, or part of a lithography illumination system.

3. The system as claimed in claim 2, wherein the opening in the housing is a lateral opening relative to the direction of a light beam through the system during use.

4. The system as claimed in claim 1, further comprising a drive device and a guide device, the drive device and the guide device being configured to move the receptacle.

5. The system as claimed in claim 1, wherein the mount is decoupled from moments of the holding structure, the mount is decoupled from moments of the clamping device in the region of the clamping device, or both.

6. The system according to claim 1, wherein a position of the holding structure is determined within the apparatus part.

7. The system as claimed in claim 1, wherein the mount is connected to the housing of the apparatus part, and the holding structure is held in the mount.

8. The system as claimed in claim 1, wherein the optical element has reference surfaces configured to allow for the detection and/or orientation of the optical element.

9. The system as claimed in claim 1, wherein spacer washers are provided for coarse prepositioning of the optical element on the holding structure.

10. The system as claimed in claim 1, wherein the holding structure comprises a manipulator device configured to set the optical element in six degrees of freedom.

11. The system as claimed in claim 1, further comprising a sensor system configured to determine a relative position and orientation of the optical element with respect to the apparatus part.

12. The system as claimed in claim 1, wherein the holding structure comprises a manipulator device configured to provide fine positioning of the optical element.

13. The system as claimed in claim 12, further comprising a control system configured to use the manipulator to carry out the fine positioning of the optical element based on data of a sensor system.

14. The system as claimed in claim 1, further comprising a sensor system to determine the position and the orientation of the optical element.

15. The system as claimed in claim 14, further comprising a control system to control the movement of the receptacle based on the position and orientation of the optical element monitored by the sensor system.

16. The system as claimed in claim 1, wherein the optical element is mounted in a statically determined manner within the apparatus part.

17. The system as claimed in claim 1, the mount is mounted in a statically determined manner within the apparatus part.

18. The system as claimed in claim 1, further comprising a second receptacle for a second optical element, the second receptacle being moveable into the housing of the apparatus part through a second opening in the housing.

19. The system as claimed in claim 18, wherein the receptacle is configured to remove the optical element from the apparatus part, and the second receptacle is configured to supply the second optical element to the apparatus part.

20. The system as claimed in claim 19, wherein the system is configured so that removal of the optical element and supply of the second optical element can be performed synchronously.

21. A method, comprising:
   providing a lithographic projection exposure apparatus including a system as claimed in claim 19;
   releasing an optical element to be removed form the holding structure, the holding structure having a manipulator device;
   using the receptacle to pick up the optical element to be removed, and, at least approximately simultaneously, using the second receptacle to pick up an optical element to be supplied;
   in an at least approximately synchronous movement, removing the optical element to be removed from the projection exposure apparatus and disposing on the holding structure the optical element to be supplied; and
   coarsely prepositioning the optical element to be supplied relative to the holding structure, and fixing the optical element to be supplied via a fixing device.

22. The method as claimed in claim 21, further comprising using the manipulator device to orient the optical element to be supplied with high accuracy relative to the housing of the lithographic projection exposure apparatus.

23. The system according to claim 18, wherein the receptacle has a store for optical elements removed from the apparatus part, the second receptacle has a store for optical elements to be supplied to the apparatus part, or both.

24. A method, comprising:

providing a lithographic projection exposure apparatus having a system as claimed in claim 1;

disposing an optical element onto the holding structure, the holding structure having a manipulator device;

coarsely prepositioning the optical element relative to the holding structure and fixing the optical element via a fixing device;

using the manipulator device to orient the optical element with high accuracy relative to the projection exposure apparatus.

* * * * *

UNITED STATES PATENT AND TRADEMARK OFFICE
CERTIFICATE OF CORRECTION

| | | |
|---|---|---|
| PATENT NO. | : 8,027,024 B2 | Page 1 of 1 |
| APPLICATION NO. | : 12/029165 | |
| DATED | : September 27, 2011 | |
| INVENTOR(S) | : Bernhard Gellrich | |

It is certified that error appears in the above-identified patent and that said Letters Patent is hereby corrected as shown below:

<u>Column 2,</u>
Line 38, Delete "propositioning" and insert --prepositioning--

Signed and Sealed this
Twenty-second Day of November, 2011

David J. Kappos
*Director of the United States Patent and Trademark Office*